(12) United States Patent
Ishikawa et al.

(10) Patent No.: US 10,374,096 B2
(45) Date of Patent: Aug. 6, 2019

(54) SEMICONDUCTOR DEVICE

(71) Applicant: Japan Display Inc., Minato-ku (JP)

(72) Inventors: Miyuki Ishikawa, Tokyo (JP);
Arichika Ishida, Tokyo (JP);
Masayoshi Fuchi, Tokyo (JP); Hajime Watakabe, Tokyo (JP); Takashi Okada, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/713,077

(22) Filed: Sep. 22, 2017

(65) Prior Publication Data

US 2018/0013006 A1 Jan. 11, 2018

Related U.S. Application Data

(63) Continuation of application No. 14/725,361, filed on May 29, 2015, now Pat. No. 9,831,349.

(30) Foreign Application Priority Data

Jun. 25, 2014 (JP) .................................. 2014-130259

(51) Int. Cl.
*H01L 27/12* (2006.01)
*H01L 27/32* (2006.01)
(Continued)

(52) U.S. Cl.
CPC ........ *H01L 29/7869* (2013.01); *H01L 21/441* (2013.01); *H01L 21/465* (2013.01); *H01L 21/467* (2013.01); *H01L 27/124* (2013.01); *H01L 27/1225* (2013.01); *H01L 27/3272* (2013.01); *H01L 29/41733* (2013.01); *H01L 29/66969* (2013.01); *H01L 29/78603* (2013.01); *H01L 29/78633* (2013.01); *H01L 29/78696* (2013.01)

(58) Field of Classification Search
None
See application file for complete search history.

(56) References Cited

U.S. PATENT DOCUMENTS

| 6,927,809 B2 | 8/2005 | Gotoh |
| 8,174,633 B2 | 5/2012 | Segawa |

(Continued)

FOREIGN PATENT DOCUMENTS

| JP | 2002-182244 A | 6/2002 |
| JP | 2003-7722 | 1/2003 |

(Continued)

OTHER PUBLICATIONS

Office Action dated Mar. 27, 2018 in Japanese Patent Application No. 2014-130259 (with English language translation), citing documents AO and AP therein, 5 pages.

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

According to one embodiment, a semiconductor device includes contact holes passing through a source region of a drain region of an interlayer insulating film and oxide semiconductor layer to reach an insulating substrate, wherein a source electrode and a drain electrode are formed inside the contact holes, respectively.

6 Claims, 3 Drawing Sheets

(51) Int. Cl.
  *H01L 29/66* (2006.01)
  *H01L 21/441* (2006.01)
  *H01L 21/465* (2006.01)
  *H01L 21/467* (2006.01)
  *H01L 29/417* (2006.01)
  *H01L 29/786* (2006.01)

(56) References Cited

U.S. PATENT DOCUMENTS

| | | |
|---|---|---|
| 2008/0217688 A1 | 9/2008 | Matsukura |
| 2009/0072289 A1 | 3/2009 | Kim |
| 2009/0269900 A1 | 10/2009 | Matsukura |
| 2013/0203214 A1* | 8/2013 | Isobe .................. H01L 21/0237 438/104 |
| 2014/0326992 A1 | 11/2014 | Hondo |
| 2015/0187823 A1* | 7/2015 | Miyairi ............... H01L 27/1225 257/43 |
| 2015/0255490 A1 | 9/2015 | Miyairi |
| 2015/0349127 A1 | 12/2015 | Kurata |
| 2016/0041493 A1 | 2/2016 | Goden |

FOREIGN PATENT DOCUMENTS

| | | |
|---|---|---|
| JP | 2004-63630 | 2/2004 |
| JP | 2007-13091 | 1/2007 |
| JP | 2008-252083 | 10/2008 |
| WO | WO 2012/056663 A1 | 5/2012 |

* cited by examiner

SEMICONDUCTOR DEVICE

CROSS-REFERENCE TO RELATED APPLICATIONS

This application is a Continuation of U.S. application Ser. No. 14/725,361 filed May 29, 2015, and is based upon and claims the benefit of priority from Japanese Patent Application No. 2014-130259, filed Jun. 25, 2014, the entire contents of each of which are incorporated herein by reference.

FIELD

Embodiments described herein relate generally to a semiconductor device and a manufacturing method for the same.

BACKGROUND

In recent years, thin-film transistors having a semiconductor layer formed of an oxide semiconductor material, and semiconductor devices and display devices including such thin-film transistors, have been under intense development. In comparison with a transistor having a conventional semiconductor layer of amorphous silicon, a thin-film transistor having a semiconductor layer of an oxide semiconductor material achieves markedly increased mobility and rapid drive performance. This is an important contribution to display devices having high definition and large displays. The most common way to refer to an oxide semiconductor material formed in an amorphous state is a transparent amorphous oxide semiconductor (TAOS) material.

DETAILED DESCRIPTION

Hereinafter, embodiments are explained with reference to accompanying drawings.

Figure 1:
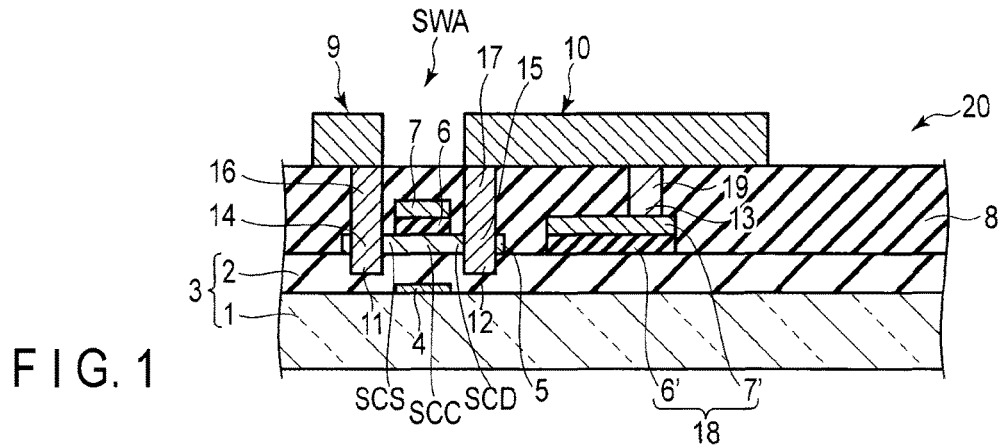
FIG. 1 shows an example of a structure of a semiconductor device of an embodiment.

FIG. 1 shows an example of a structure of a semiconductor device of an embodiment.

In the example depicted, a semiconductor device 20 includes a thin-film transistor SWA and an interconnect layer 7'.

On an insulating substrate 3 of the thin-film transistor SWA, an oxide semiconductor layer 5 including a channel region, and a source region SCS and a drain region SCD disposed at both sides of the channel region, respectively. The oxide semiconductor layer 5 is formed of an oxide containing at least one of, for example, indium (In), gallium (Ga), zinc (Zn), and tin (Sn). As representative materials used for the oxide semiconductor layer, there are indium gallium zinc oxide (IGZO), indium gallium oxide (IGO), indium zinc oxide (IZO), zinc tin oxide (ZnSnO), and zinc oxide (ZnO). In particular, IGZO is commonly used for a transparent amorphous oxide semiconductor.

On the channel region of the oxide semiconductor layer 5, a gate insulating film 6 is formed to expose the source region SCS and the drain region SCD. A gate electrode 7 is formed on the gate insulating film 6. The gate electrode 7 is formed of, for example, copper (Cu), aluminum (Al), titanium (Ti), molybdenum (Mo), tungsten (W), tantalum (Ta), and chromium (Cr), or an alloy containing at least one of these elements.

An interlayer insulating film 8 covers the gate electrode 7, the source region SCS and the drain region SCD of the oxide semiconductor layer 5, and gate insulating film 6. Furthermore, the interlayer insulating film 8 is disposed on an insulating substrate 3. The interlayer insulating film 8 is, for example, formed of silicon oxide ($SiO_x$) to have a thickness of 600 nm.

A source electrode 9 and a drain electrode 10 contact the source region SCS and the drain region SCD of the oxide semiconductor layer 5, respectively. The source electrode 9 is formed inside a first contact hole 11, and the drain electrode 10 is formed inside a second contact hole 12. The source electrode 9 and the drain electrode 10 on the interlayer insulating film 8 have a thickness of 300 to 1000 nm, individually. The first contact hole 11 used for the thin-film transistor SWA includes a first aperture 14 passing through the oxide semiconductor layer 5 and a third aperture 16 passing through the interlayer insulating film 8 to connect with the first aperture 14, and reaches the insulating substrate 3. The second contact hole 12 used for the thin-film transistor SWA includes a second aperture 15 passing through the oxide semiconductor layer 5 and a fourth aperture 17 passing through the interlayer insulating film 8 to connect with the second aperture 15, and reaches the insulating substrate 3.

Here, a contact between the oxide semiconductor layer 5 and the source region SCS is made on the inner wall of the first aperture 14. A contact between the drain electrode 10 and the oxide semiconductor layer 5 is made on the inner wall of the second aperture 15. For example, when apertures are formed to individually pass through a source region SCS and a drain region SCD of a polycrystalline semiconductor layer and contacts between the polycrystalline semiconductor layer and the source electrode or the drain electrode are made on the inner wall of each aperture, many defects are produced on the inner wall which is formed by etching. Even when a low resistivity treatment is performed by doping phosphorus therein, the activation of the dopant is difficult and sufficiently low resistivity is not obtained. Therefore, resistance to contact tends to be high on the inner wall. In contrast, in the oxide semiconductor layer used in the embodiment, the defects on the inner wall of each aperture formed by etching apparently function as donors, thereby imparting low resistivity to the inner wall; and thus, contacts between the oxide semiconductor layer and the source electrode or the drain electrode can be made sufficiently on the inner wall alone.

Each of the source electrode 9 and the drain electrode 10 is formed of, for example, copper (Cu), aluminum (Al), titanium (Ti), molybdenum (Mo), tungsten (W), tantalum (Ta), and chromium (Cr), or an alloy containing at least one of these elements.

The insulating substrate 3 may further include an undercoat layer 2 formed of an insulating material and between a support substrate 1 and the oxide semiconductor layer 5. The undercoat layer 2 is formed of, for example, silicon oxide ($SiO_x$). The support substrate may be a substrate formed of an insulating material such as glass and resin. The insulating substrate may be formed hard or flexible as occasion demands.

A light shielding layer 4 may be provided between the support substrate 1 and the undercoat layer to be opposed to the oxide semiconductor layer 5. The light shielding layer 4 is formed of, for example, copper (Cu), aluminum (Al), titanium (Ti), molybdenum (Mo), tungsten (W), tantalum (Ta), and chromium (Cr), or an alloy containing at least one of these elements.

Furthermore, on the insulating substrate 3, an insulating layer 6' formed of the same material used for the gate insulating film 6 may be formed and an interconnect layer 7' formed of the same material used for the gate electrode 7 may be formed on the insulating layer 6'. On the interconnect layer 7', a third contact hole is formed to pass through the interlayer insulating film 8 to reach the interconnect layer 7'. The interconnect layer 7' connects to the drain electrode 10 through the third contact hole.

FIGS. 2A to 2D show an example of a manufacturing method for a semiconductor device of the embodiment.

A transparent glass substrate is prepared as a support substrate 1.

Figure 2A:
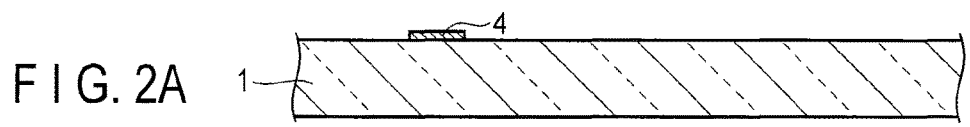
FIGS. 2A, 2B, 2C, and 2D show an example of a manufacturing method for a semiconductor device of the embodiment.

As shown in FIG. 2A, a light shielding layer 4 is formed on the support substrate 1 initially. In the example depicted, the light shielding layer 4 is formed of Mo using a sputtering method, for example.

Figure 2B:

Then, as shown in FIG. 2B, an undercoat layer 2 is formed to cover the support substrate 1 along with the light shielding layer 4. An insulating substrate 3 is thus obtained. The undercoat layer 2 is formed of $SiO_2$ or SiN to have a thickness of 100 nm by plasma CVD, for example.

Then, the oxide semiconductor layer 5 is formed to be opposed to the light shielding layer 4. A transparent amorphous semiconductor layer formed of indium gallium zinc oxide (IGZO) using a sputtering method involving a gaseous mixture of argon (Ar) and oxygen ($O_2$) is applied to the undercoat layer 2 and this semiconductor layer is patterned into the oxide semiconductor layer 5. The oxide semiconductor layer 5 may be set to 50 nm, or 30 to 40 nm.

Figure 2C:
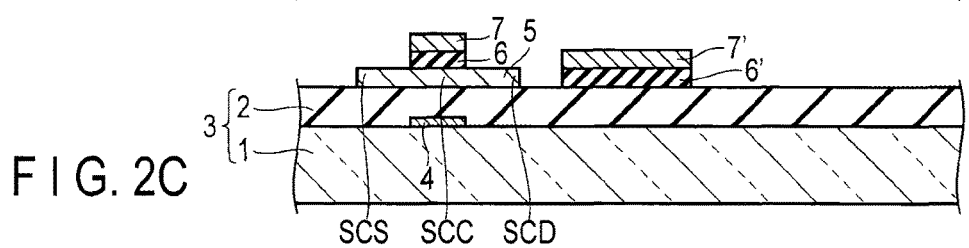

Furthermore, as shown in FIG. 2C, the oxide semiconductor layer 5 is partly exposed to form a gate insulating film 6 having a thickness of, for example, 100 nm on the oxide semiconductor layer 5 along with a gate electrode 7 having a thickness of, for example, 200 to 300 nm on the gate insulating film 6. When the gate insulating film 6 and the gate electrode 7 are formed, the insulating layer 6' and the interconnection layer 7' each having a thickness of, for example, 100 nm are formed using the same material.

This process is explained into more detail. Initially, an insulating material layer to form the gate insulating film 6 is formed on substantially the entirety of the surface of the undercoat layer 2 on which the oxide semiconductor layer and the like are formed. The gate insulating film 6 is formed of silicon oxide ($SiO_x$) by the plasma CVD. Then, a gate metal layer is formed on the gate insulating film 6 to form the gate electrode 7. The gate metal layer is formed by the sputtering method. Using a resist pattern formed on the layers of the gate electrode and interconnection layer 7' as a mask, the insulating material layer and the gate metal layer are patterned at the same time. Thereby, the gate insulating film 6 and the gate electrode 7 are formed and an interconnection 18 composed of the insulating layer 6' and the interconnection layer 7' is formed. The insulating material layer and the gate metal layer are patterned using a reactive ion etching (RIE) method.

Through the above, the oxide semiconductor layer 5 to be a channel region and the gate insulating film 6 are formed. Furthermore, the gate electrode 7 layered on the gate insulating film 6 and the interconnection 18 are formed. Furthermore, the parts of the oxide semiconductor layer 5 to be the source region SCS and the drain region SCD are exposed from the apertures formed in the gate insulating film 6.

Then, high resistivity is imparted to the entire oxide semiconductor layer 5. As a method to impart high resistivity, annealing in an atmosphere containing, for example, an oxidizing gas is possible. The oxidizing gas may be a mixture of oxygen ($O_2$) and nitrogen ($N_2$) at a mixing ratio of 1:3, for example. Here, annealing is performed in an atmosphere consisting of a gaseous mixture of such an oxidizing gas for 30 minutes at a temperature of 270° C.

The method to impart high resistivity is not limited to the above example. For example, annealing may be performed in an atmosphere containing moisture.

Through this annealing of the oxide semiconductor layer 5, the parts thereof exposed from the gate insulating film 6 are oxidized to be highly resistive and the oxidization proceeds immediately below the gate insulating film 6 (that is, oxygen diffuses into a region immediately blow the gate insulating film 6). Consequently, high resistivity is imparted to the entire oxide semiconductor layer 5.

Then, low resistivity is imparted to the parts of the oxide semiconductor layer 5 exposed from the gate insulating film 6 and the source region SCS and the drain region SCD are formed. As a method for imparting low resistivity, annealing in an atmosphere containing a reducing gas can be cited. The reducing gas may be silane ($SiH_4$). In this process, annealing is performed in an atmosphere consisting of a gaseous mixture of such a reducing gas for 30 seconds at a pressure of 160 Pa and a temperature of 350° C. This annealing process to impart low resistivity is performed within a relatively short period to avoid the part having low resistivity to proceed to immediately below the gate insulating film 6.

The method for imparting low resistivity is not limited to the above annealing process conducted in an atmosphere containing a reducing gas. For example, the method may be annealing in a vacuum or in an inert gas atmosphere, or may be a plasma process in an inert gas atmosphere or in a reducing gas atmosphere, or may be annealing with a cover film containing hydrogen.

Through this annealing process of the oxide semiconductor layer 5, the parts thereof exposed form the gate insulating film 6 are reduced, thereby attaining low resistivity, while the part immediately below the gate insulating film 6 is hardly reduced, thereby maintaining high resistivity. Consequently, a high-resistivity channel region is formed immediately below the gate insulating film 6 while low-resistivity source region SCS and drain region SCD are formed at the parts exposed from the gate insulating film 6 at both sides of the channel region, respectively.

Figure 2D:
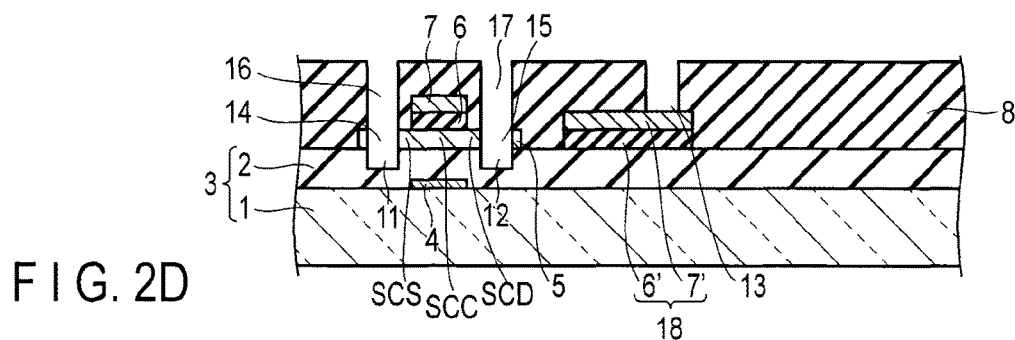

Then, as shown in FIG. 2D, an interlayer insulating film 8 is formed. The interlayer insulating film 8 is formed of silicon oxide ($SiO_x$) by the plasma CVD. The process to impart low resistivity to the source region SCS and the drain region SCD and the process to form the interlayer insulating film 8 are performed consecutively in the same chamber.

In the plasma CVD to form the interlayer insulating film 8, a gaseous mixture of silane and nitrogen monoxide ($N_2O$) at a mixing ratio of 1:50 was used, for example.

Then, the interlayer insulating film 8 and the source region SCS of the oxide semiconductor layer 5 are patterned through until the undercoat layer 2 is exposed. Consequently, the third aperture 16 is provided on the interlayer insulating film on the source region SCS and the first aperture 14 is provided on the oxide semiconductor layer in the source region, and together a first contact hole 11 is formed to reach the undercoat layer 2 of the insulating substrate 3. At the same time, the interlayer insulating film 8 and the drain region SCD of the oxide semiconductor layer 5 are patterned through until the undercoat layer 2 is exposed. Consequently, the fourth aperture 17 is provided on the interlayer insulating film on the drain region SCD and the second aperture 15 is provided on the oxide semiconductor layer in the source region, and together a second contact hole 12 is formed to reach the undercoat layer 2 of the insulating substrate 3. At the same time, the interlayer insulating film 8 is patterned through until the interconnection layer 7' is exposed to form a third contact hole 13.

The first to third contact holes 11, 12, and 13 are formed at the same time using the resist pattern (details are omitted) by the reactive ion etching (RIE) method. If the first and second contact holes 11 and 12 are formed not to pass through the oxide semiconductor layer 5 having a thickness of only 50 nm or less, the third contact hole 13 which is etched at the same time may not reach the interconnection layer 7', and thus, etching control becomes difficult. In contrast, the first and second contact holes 11 and 12 are formed to pass through the oxide semiconductor layer 5 in the present embodiment, and thus, the third contact hole 13 which is etched at the same time reaches the interconnection layer 7' efficiently, and thus, etching control can be performed easily.

Furthermore, if the first and second contact holes 11 and 12 are formed to pass through a low-melting polycrystalline silicon semiconductor layer instead of the oxide semiconductor layer, a hydrogen fluoride treatment is necessary to impart high resistivity to the oxide semiconductor layer 5. In this treatment, hydrogen fluoride permeates between the oxide semiconductor layer 5 and the undercoat layer 2 through the first and second contact holes 11 and 12 and defects tend to occur. In contrast, there is no necessity of a hydrogen fluoride treatment for the oxide semiconductor layer used in the present embodiment, and accordingly, such defects do not appear.

Then, a source electrode 9 is formed within the first contact hole 11 to contact the source region SCS at the inner wall of the first aperture 14 and to reach the undercoat layer 2, and a drain electrode 10 is formed within the second contact hole 12 to contact the drain region SCD at the second aperture 15 and to reach the undercoat layer 2, and a conductive layer 19 is formed within the third contact hole.

The source electrode 9, drain electrode 10, and conductive layer 19, are formed by preparing a metal film using a sputtering method or the like and patterning the metal film. The metal film is a laminated film composed of molybdenum (No), aluminum (Al), and titanium (Ti), for example.

Through the above, a semiconductor device comprising a thin-film transistor SWA as shown in FIG. 1 can be manufactured.

Figure 3:
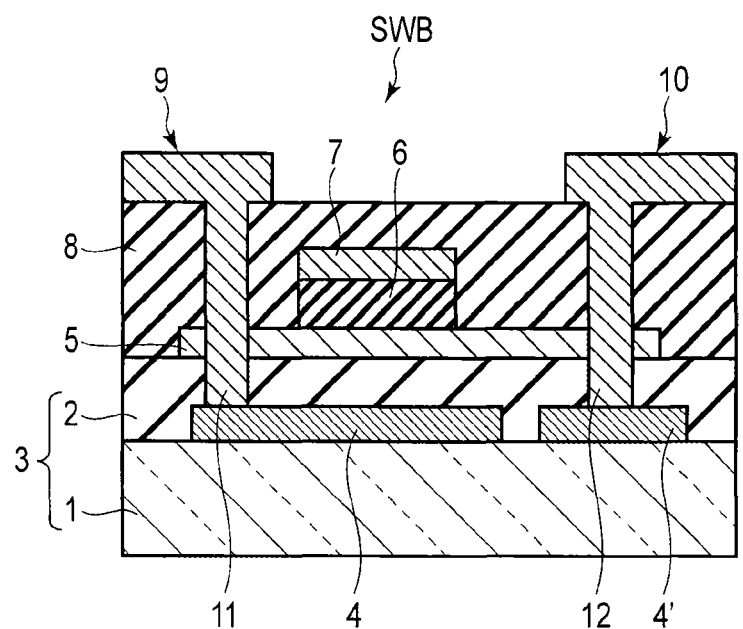
FIG. 3 shows another example of a thin-film transistor structure usable in the semiconductor device of the embodiment.

FIG. 3 shows another example of a thin-film transistor structure usable in the semiconductor device of the embodiment.

As depicted, a thin-film transistor SWB shown in FIG. 3 is formed the same as the thin-film transistor SWA shown in FIG. 1 except that a light shielding layer 4 formed on a support substrate 1 is further extended to a source electrode 9 side, that a first contact hole 11 is formed to reach the light shielding layer 4, that a light shielding layer 4' is formed separately from the light shielding layer 4 at the same time, that a second contact hole 12 is formed to each the light shielding layer a source electrode 9 is formed within a first contact hole 11 to contact a source region SCS and connects with the light shielding layer 4, and that a drain electrode 10 is formed within the second contact hole 12 to contact a drain region SCD and connects with the light shielding layer 4'.

When a potential of a light shielding layer becomes unstable by an influence of a nearby conductive material, an adverse effect may occur to an oxide semiconductor layer opposed to the light shielding layer. In contrast, the thin-film transistor as in FIG. 3 comprises light shielding layers 4 and 4' contact the source electrode 9 and the drain electrode 10, respectively and connect with a power source. Thus, the potential is stable and an adverse effect to the oxide semiconductor layer 5 can be suppressed.

The thin-film transistors SWA and SWB in FIGS. 1 and 3 can be used in a semiconductor device and can be incorporated into a display device through a manufacturing process of, for example, a liquid crystal display device or an organic electroluminescent device.

Figure 4:
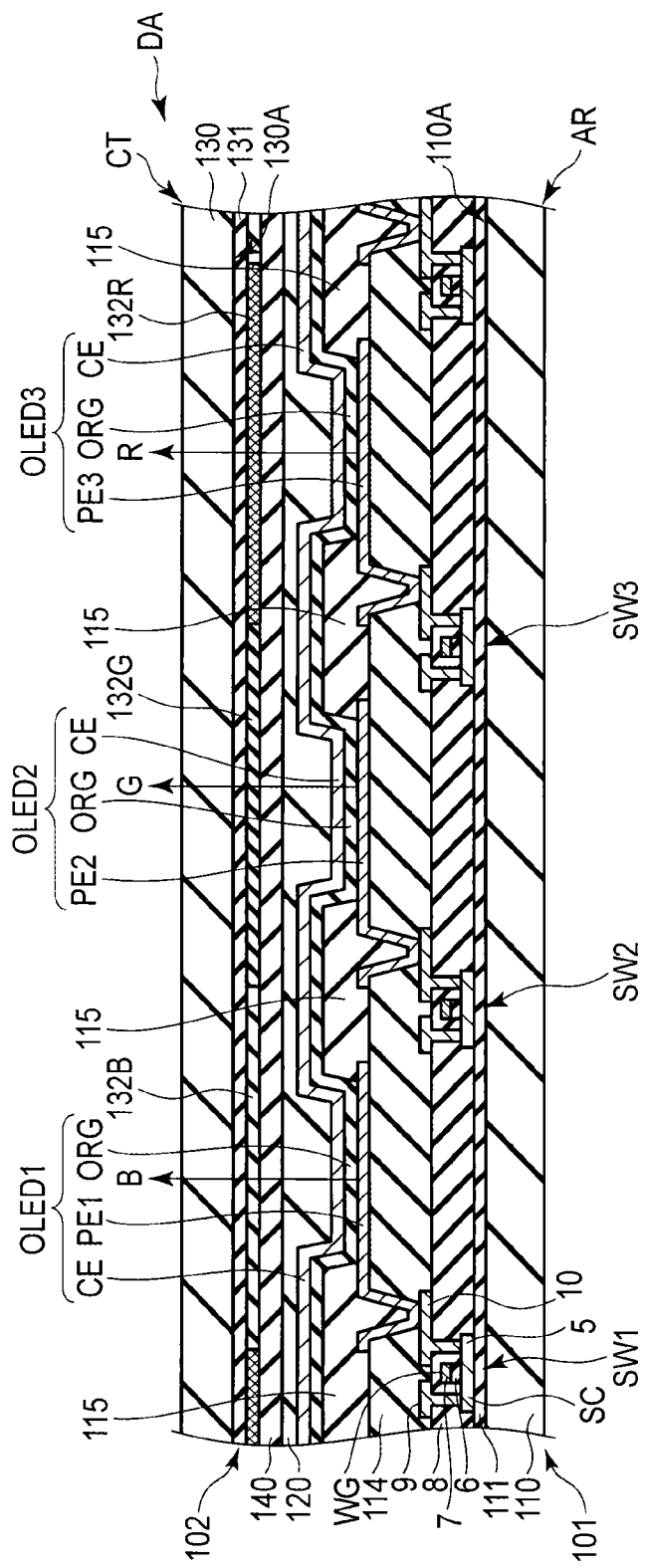
FIG. 4 shows an example of a structure of a display device of the embodiment.

FIG. 4 is a cross-sectional vie which schematically shows a structural example of a display device to which the thin-film transistor SWA is applied.

In this embodiment, a display device DA is an organic electroluminescent display device as a sheet display. FIG. 4 shows a cross-sectional structure of the organic electroluminescent display device.

As in FIG. 4, the organic electroluminescent display device is of active matrix drive type and includes an array substrate AR and a countersubstrate CT. The array substrate AR is formed based on a first resin layer 110. The array substrate AR includes, at an inner surface 110A side of the first resin layer 110, a first insulating film 111, second insulating film 112, interlayer insulating film 8, third insulating film 114, rib 115, switching elements SW1 to SW3, and organic electroluminescent devices OLED1 to OLED3 as display elements.

The first resin layer 110 is an insulating layer whose main component is polyimide (PI), for example. The first resin layer 110 has a thickness of 5 to 30 μm, for example. The first resin layer 110 may be formed of a heat resistive material such as polyamidimide and polyaramide instead of polyimide. That is, the first resin layer 110 is exposed to high temperature processes several times during the formation of various insulating films, the formation of switching elements, the formation of organic electroluminescent diodes, and the like. Therefore, flexibility and heat resistance are the most important characteristics for the first resin layer 110. The organic electroluminescent device is of top-emission type which emits light through the countersubstrate CT, and thus, the first resin layer 110 does not necessarily possess high transparency and may be painted.

The inner surface 110A of the first resin layer 110 is covered by the first insulating film 111. The first insulating film 111 is formed on the surface of the first resin layer 110. The first insulating film 111 should preferably be formed on the first resin layer 110 with an adhesion force of 0.2 N/mm or less. Note that the adhesion force is obtained through a 90° peeling test. In this 90° peeling test, a resistance force is measured when the first insulating film 111 is peeled off the first resin layer 110 at a peeling angle of 90°, at a predetermined timing and a predetermined peeling speed. The test is performed to acquire convenient peeling performance at the time when the first resin layer 110 and the first insulating film 111 are peeled off from each other in a later process, and what should be noted here is that, if the adhesion between the first resin layer 110 and the first insulating film 111 is too low, unintentional peeling would occur in in-between processes due to a thermal, chemical or physical stress.

The first insulating film 111 functions as a first barrier layer which suppress the ion impurity impingement from and the moisture impingement through the first resin layer 110. The first insulating film 111 is formed of inorganic materials such as silicon nitride ($SiN_x$), silicon oxide ($SiO_2$), and silicon oxynitride (SiON) and formed as a multilayer structure. For example, the first insulating film 111 is formed of a multilayer film including silicon nitride and silicon oxide layered one on another. The first insulating film 111 may be formed of other materials which securely function as a barrier.

Switching elements SW1 to SW3 are formed above the first insulating film 111. Switching elements SW1 to SW3 are each formed as a thin-film transistor (TFT) including a semiconductor layer SC. Switching elements SW1 to SW3 are structured the same and switching element SW1 is focused here to explain the detailed structure.

In the example depicted, switching element SW1 is formed as a top-gate type but may be formed as a bottom-gate type. The semiconductor layer SC is, for example, formed of a silicon material such as amorphous silicon and polysilicon, or an oxide semiconductor which is an oxide including at least one of indium (In), gallium (Ga), and zinc (Zn).

The semiconductor layer SC is formed on the first insulating film 111. On the semiconductor layer SC, the gate insulating film 6 is formed and the gate electrode 7 of the switching element SW1 is formed thereupon. The gate electrode 7 is covered by the interlayer insulating film 8. The interlayer insulating film 8 is also disposed on the first insulating film 111.

Source electrode 9 and drain electrode 10 of switching element SW1 are formed on the interlayer insulating film 8. Source electrode 9 and drain electrode 10 contact the source region and drain region of the semiconductor layer SC, respectively. Source electrode 9 and drain electrode 10 are covered by the third insulating film 114. The third insulating film 114 is also disposed on the interlayer insulating film 8.

Organic electroluminescent devices OLED1 to OLED3 are formed on the third insulating film 114. In the example depicted, organic electroluminescent device OLED1 is electrically connected with switching element SW1, organic electroluminescent device OLED2 is electrically connected with switching element SW2, and organic electroluminescent device OLED3 is electrically connected with switching element SW3. Organic electroluminescent devices OLED1 to OLED3 each emit white light. Organic electroluminescent devices OLED1 to OLED3 have the same structure.

Organic electroluminescent device OLED1 includes pixel electrode PE1 formed on the third insulating film 114. Pixel electrode PE1 contacts the drain electrode 10 of switching element SW1 and is electrically connected to switching element SW1. Similarly, organic electroluminescent device OLED2 includes pixel electrode PE2 electrically connected to switching element SW2, and organic electroluminescent device OLED3 includes pixel electrode PE3 electrically connected to switching element SW3.

Pixel electrodes PE1 to PE3 function as, for example, positive electrodes. Pixel electrodes PE1 to PE3 may be formed of a transparent conductive material such as indium tin oxide (ITO) and indium zinc oxide (IZO), or may be formed of a metal such as aluminum (Al), magnesium (Mg), silver (Ag), or titanium (Ti), or may be formed of an alloy of these metals. If the organic electroluminescent device is of top-emission type, pixel electrodes PE1 to PE3 should preferably include a reflective layer formed of a metal of high reflectivity.

Organic electroluminescent devices OLED1 to OLED3 each further include an organic luminescent layer ORG and a common electrode CE. The organic luminescent layer ORG is positioned above each of pixel electrodes PE1 to PE3. Furthermore, the organic luminescent layer ORG is formed continuously over Organic EL elements OLED1 to OLED3 without a cut. The common electrode CE is positioned above the organic luminescent layer ORG. Furthermore, the common electrode CE is formed continuously over organic EL elements OLED1 to OLED3 without a cut. The common electrode CE is formed of a transparent conductive material such as ITO and IZO.

That is, organic electroluminescent device OLED1 is composed of pixel electrode PE1, organic luminescent layer ORG, and common electrode CE. Similarly, organic electroluminescent device OLED2 is composed of pixel electrode PE2, organic luminescent layer ORG, and common electrode CE, and organic electroluminescent device OLED3 is composed of pixel electrode PE3, organic luminescent layer ORG, and common electrode CE.

Note that, in organic electroluminescent devices OLED1 to OLED3, a hole injection layer and a hole transportation layer may be additionally interposed between each of pixel electrodes PE1 to PE3 and the organic luminescent layer ORG. Furthermore, an electron injection layer and an electron transportation layer may be interposed between the organic luminescent layer ORG and the common electrode CE.

Organic electroluminescent devices OLED1 to OLED3 are partitioned by ribs 115 one from another. The ribs 115 are formed on the third insulating film 114 and cover the edges of pixel electrodes PE1 to PE3. Note that, although the details are omitted, the rib 115 is formed in, for example, a lattice shape or in a stripe shape on the third insulating film 114. The rib 115 is covered by the organic luminescent layer ORG. That is, the organic luminescent layer ORG extends not only over pixel electrodes PE1 to PE3 but also over the rib 115.

In the example depicted, organic electroluminescent devices OLED1 to OLED3 are sealed by a sealing film 120. The sealing film 120 functions as a barrier which protects organic electroluminescent devices OLED1 to OLED3 from contaminants such as moisture, oxygen, and hydrogen. The sealing film 120 is formed of an inorganic material such as silicon nitride ($SiN_y$), silicon oxide ($SiO_x$), or silicon oxynitride (SiON) and is formed as a monolayer or a multilayer structure. The sealing film 120 is formed optionally.

As above, a first multilayer 101 is produced. Here, the first multilayer 101 refers to the layers positioned between the first resin layer 110 and the sealing film 120, and includes the first insulating film 111, switching elements SW1 to SW3, organic electroluminescent devices OLED1 to OLED3, and the like.

The countersubstrate CT is formed of a transparent second resin layer 130. The countersubstrate CT includes, at the inner surface 30A side of the second resin layer 30, a fifth insulating film 131, color filter, and the like. The color filter includes a blue layer 132B, a green layer 132G, and a red layer 132R.

The second resin layer 130 is opposed to the first insulating film 111 (first multilayer 1) with the fifth insulating film 131 intervening therebetween. The second resin layer 130 is a transparent insulating layer and is formed on the surface of the fifth insulating film 131 using a material whose main component is polyimide (PI). The second resin layer 130 has a thickness basically equal to that of the first resin layer 110 which is, for example, 5 to 30 μm. The second resin layer 130 is formed of a highly transmissive material. That is, organic electroluminescent devices OLED1 to OLED3 of the top-emission type emit light which transmits the second resin layer 130.

Thus, the most important characteristics required for the second resin layer 130 are flexibility and high transmissivity. As can be understood from the above, what is required for the first resin layer 110 and what is required for the second resin layer 130 are different. Thus, the second resin layer 130 may be formed of a material different from that of the first resin layer 110. For example, the first resin layer 110 is formed of nontransparent and highly heat resistive polyimide while the second resin layer 130 is formed of transparent polyimide.

The inner surface 130A of the second resin layer 130 is covered by the fifth insulating film 131. The fifth insulating film 131 is formed on the surface of the second resin layer 130. The fifth insulating film 131 should preferably be formed on the second resin layer 130 with an adhesive force of 0.2 N/mm or less. The adhesive force is obtained through a 90° peeling test. The fifth insulating film 131 functions as a second barrier layer which suppress the ion impurity impingement from and the moisture impingement through the second resin layer 130. The fifth insulating film 131 is formed as a multilayer structure.

The fifth insulating film (second barrier layer) 131 is formed through the same manufacturing process with the same manufacturing conditions as those of the first insulating film (first barrier layer) 111. The fifth insulating film 131 is formed in the same manner as the first insulating film 111. As to the fifth insulating film 131, the layering order of the layers, materials and thicknesses are the same as those of the first insulating film 111. For example, the fifth insulating film 131 is, similarly to the first insulating film 111, formed of a multilayer film including silicon nitride and silicon oxide layered one on another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a support substrate;
   a metal layer formed on the support substrate;
   an undercoat layer made of an insulating material and formed to cover the metal layer;
   a semiconductor layer formed on the undercoat layer, the semiconductor layer including a channel region, and a source region and a drain region disposed at sides of the channel region;
   a gate insulating film formed on the channel region;
   a gate electrode formed on the gate insulating film;
   an interlayer insulating film covering the gate electrode, the semiconductor layer, and the gate insulating film;
   a source electrode electrically connected with the source region;
   a drain electrode electrically connected with the drain region; and
   an interconnection formed in the same layer and with the same material as the gate electrode, the interconnection provided between an insulating film formed in the same layer and with the same material as the gate insulating film and the interlayer insulating film;
   wherein at least one of the source electrode and the drain electrode contacts the semiconductor layer and passes through one contact hole provided in the interlayer insulating film and the undercoat layer to electrically connect with the metal layer while passing through a different contact hole provided in the interlayer insulating film, but not through the undercoat layer, to electrically connect with the interconnection.

2. The semiconductor device of claim 1, wherein the metal layer comprises a first metal layer electrically connected with the source electrode and a second metal layer electrically connected with the drain electrode, and the first metal layer and the second metal layer are separated from each other.

3. The semiconductor device of claim 1, wherein at least one of the source electrode and the drain electrode contacts a side face of the semiconductor layer to electrically connect with the metal layer.

4. The semiconductor device of claim 1, wherein at least one of the source electrode and the drain electrode passes through the semiconductor layer to electrically connect with the metal layer.

5. The semiconductor device of claim 1, wherein the semiconductor layer is made of oxide semiconductor.

6. The semiconductor device of claim 1, wherein the semiconductor layer has a thickness of 30 to 40 nm.

* * * * *